(12) United States Patent
Adler et al.

(10) Patent No.: US 6,259,128 B1
(45) Date of Patent: Jul. 10, 2001

(54) METAL-INSULATOR-METAL CAPACITOR FOR COPPER DAMASCENE PROCESS AND METHOD OF FORMING THE SAME

(75) Inventors: Eric Adler, Jericho; Henry W. Trombley, Bristol, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/298,122

(22) Filed: Apr. 23, 1999

(51) Int. Cl.[7] .................................................. H01L 29/72
(52) U.S. Cl. .......................... 257/301; 257/296; 257/529; 257/532; 438/393; 438/618; 438/687; 438/694
(58) Field of Search ..................................... 257/296, 301, 257/529, 532; 438/618, 687, 393, 694

(56) References Cited

U.S. PATENT DOCUMENTS

| | | |
|---|---|---|
| 5,523,253 | 6/1996 | Gilmour et al. . |
| 5,723,898 * | 3/1998 | Gilmore et al. ...................... 257/296 |
| 5,795,819 | 8/1998 | Motsiff et al. . |
| 6,037,258 * | 3/2000 | Liu et al. ............................. 257/296 |

* cited by examiner

*Primary Examiner*—Edward Wojciechowicz
(74) *Attorney, Agent, or Firm*—McGinn & Gibb, PLLC; Howard J. Walter, Jr. Esq.

(57) ABSTRACT

A capacitor structure formed on a semiconductor substrate may include a first interconnect wiring (such as copper damascene) and a first conductive barrier layer in contact with the first interconnect wiring. A first capacitor plate, a capacitor dielectric structure and a second capacitor plate may also be included over the first conductive barrier layer. A second conductive barrier layer may be formed on the second capacitor plate and a second planar insulating structure may be formed over the second capacitor plate. Finally, a second interconnect wiring may be embedded within a second planar insulator structure.

19 Claims, 3 Drawing Sheets

US 6,259,128 B1

METAL-INSULATOR-METAL CAPACITOR FOR COPPER DAMASCENE PROCESS AND METHOD OF FORMING THE SAME

BACKGROUND OF THE INVENTION

1. Field of the Invention

The present invention generally relates to a metal-insulator-metal capacitor for a metal damascene process and a method of manufacturing the same.

2. Description of the Related Art

Precision capacitors for complementary metal oxide semiconductor (CMOS) analog applications are generally metal-insulator-metal (MIM) capacitors or polysilicon-insulator-polysilicon (P-P) capacitors.

However, P-P capacitors are becoming less popular because they present a number of problems when used with complementary metal oxide semiconductor (CMOS) technologies. More specifically, P-P capacitors are generally performed before the CMOS structures and the heat and oxidation cycles which occur during the CMOS production process degrade the P-P capacitors. Further, the sophistication of analog circuits is improving which requires that the variation in the capacitance be decreased and preferably maintained at a voltage of approximately 25 ppM. However, P-P capacitors suffer from carrier depletion which changes the capacitance as surface voltage across the P-P capacitor changes. Therefore, P-P capacitors do not maintain the linearity required in today's sophisticated analog circuits. Further, P-P capacitors often trap charges within the insulator during their use.

Therefore, MIM capacitors, which are usually formed after the CMOS production process, are generally becoming more popular for analog circuits. However, MIM capacitors also present manufacturing problems. More specifically, conventional MIM capacitors with an $SiO_2$ insulator cannot be used over copper damascene metal wiring because copper diffuses through the capacitor structure and creates leakage. In other words, the copper is not a good electrode in the conventional capacitor structures. Therefore, conventional MIM capacitors are generally only used with aluminum wiring. This is a substantial disadvantage because copper damascene wiring is becoming more popular in CMOS technologies because copper is less expensive and has better conductivity and electromigration resistance when compared to aluminum wiring.

Therefore, there is a need for a process and structure which allows MIM capacitors to be used with copper damascene wiring.

SUMMARY OF THE INVENTION

It is, therefore, an object of the present invention to provide a structure and method for producing a metal-insulator-metal capacitor, which uses a damascene metal such as copper.

The capacitor structure may be formed on a semiconductor substrate. The capacitor structure according to the present invention may include a first interconnect wiring such as a copper damascene metal which is embedded within a first planar insulator structure. The capacitor structure may also include a first conductive barrier layer such as tantalum nitride (TaN) on the first planar insulator structure. The first conductive barrier layer may contact the exposed portion of the first interconnect wiring. The capacitor structure may include a first capacitor plate (such as aluminum) formed on the first conductive barrier layer. A capacitor dielectric structure may be provided on the first capacitor plate. A second capacitor plate (such as aluminum) may be formed on the dielectric structure and a second conductive barrier layer may be formed on the second capacitor plate. The capacitor structure may also include a second planar insulating structure formed over the second capacitor plate and a second interconnect wiring embedded within the second planar insulator structure.

A method of forming the metal-insulator-metal capacitor structure according to the present invention may include forming a metal damascene region on a semiconductor substrate, forming a first barrier layer on the metal damascene region such that the first barrier layer contacts the metal damascene region, forming a metal-insulator-metal capacitor on the first barrier layer, and applying an insulating layer on the metal-insulator-metal capacitor.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS OF THE INVENTION

Figure 1:
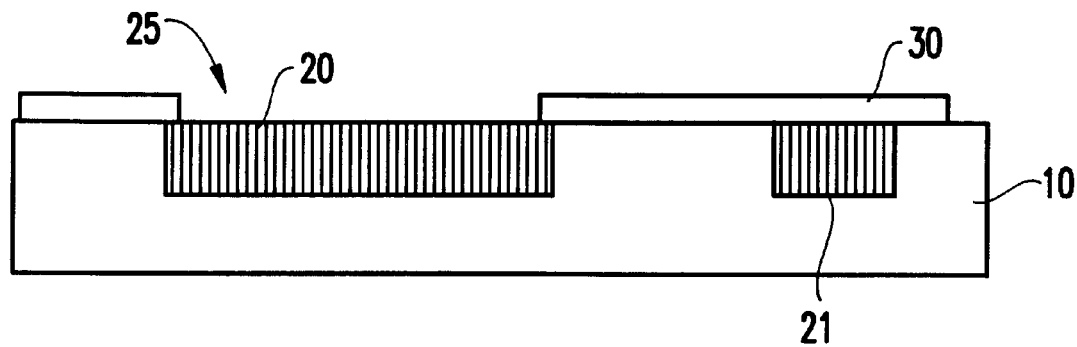
FIG. 1 is a diagram showing a copper damascene layer on an insulating structure.

FIG. 1 shows a semiconductor substrate 10 such as a tantalum nitride substrate in which openings are formed using conventional masking and etching processes. A metal damascene layer 20 is then deposited in the openings and the structure is planarized using, for example, chemical mechanical polishing (CMP). In the preferred embodiment, the metal damascene layer 20, 21 is copper although other metals (such as gold) are also within the scope of this invention. Subsequently, a silicon nitride ($Si_3N_4$) layer 30 is provided over the copper damascene layer 20, 21 and the semiconductor substrate 10. The silicon nitride layer 30 is subsequently masked and etched in the areas where the metal-insulator-metal capacitor will be provided and where the via will be formed. FIG. 1 shows a gap area 25 in the silicon nitride layer 30 where the metal-insulator-metal capacitor will be formed.

Figure 2:
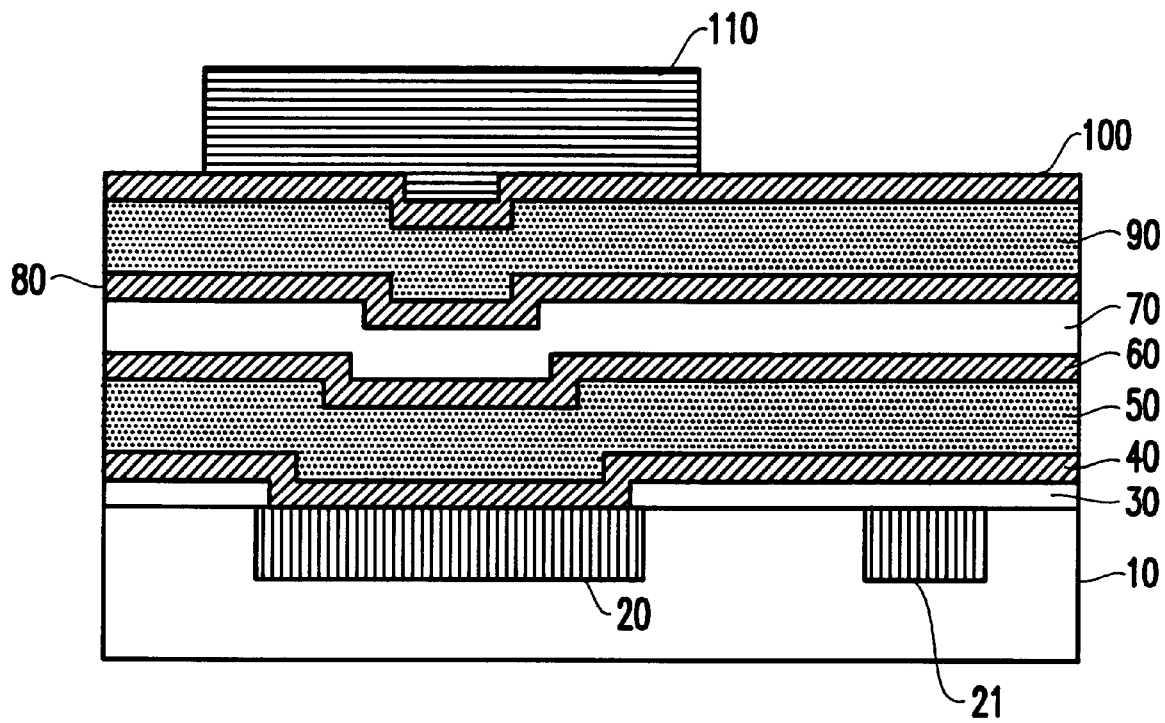
FIG. 2 shows a side view of a metal-insulator-metal capacitor structure according to the present invention.

FIG. 2 shows the metal-insulator-metal capacitor formed over the copper damascene layer 20. As shown in FIG. 2, a barrier layer 40 such as tantalum nitride (TaN) may be formed over the silicon nitride layer 30 and in the gap 25 such that the barrier layer 40 is in contact with the copper damascene layer 20. The barrier layer 40 helps prevent copper in the copper damascene layer 20 from diffusing into the overlying conductor layer 50 and insulator layer 70, which will be described below.

A bottom electrode 50 such as a thin layer of aluminum (Al), tungsten (W) or other suitable metal may then be formed over the barrier layer 40. A barrier layer 60, such as a titanium nitride (TiN) layer, may then be formed over the bottom electrode 50. The barrier layer 60 helps keep the metal in the bottom electrode 50 away from the insulator layer 70. The insulator layer 70 (also referred to as a capacitor dielectric structure), preferably made of silicon dioxide ($SiO_2$), may then be formed over the barrier layer 60. A barrier layer 80 preferably made of titanium nitride (TiN) may then be formed over the insulator layer 70. A top electrode 90 of the metal-insulator-metal capacitor may then be formed over the barrier layer 80 preferably using aluminum, although any other suitable metal layer may be used. FIG. 2 also shows a barrier layer 100, preferably made of tantalum nitride (TaN) or other suitable barrier layer, which may be formed over the top electrode 90. The foregoing layers can be formed using any conventional process, such as chemical vapor deposition (CVD), sputtering, evaporation, etc. If the conductivity of barrier layers 100 and 40 is sufficient (i.e., the resistivity is not too high), then layers 30, 60 and 80 may be omitted from the capacitor structure.

In order to properly size the metal-insulator-metal capacitor, a photo mask 110 is applied over the metal-insulator-metal capacitor stack before etching the respective layers 30, 40, 50, 60, 70, 80, 90 and 100 in a well known manner. The etchant is selective (e.g. HCl, etc.) so that the barrier layer 30 is preferably not etched to avoid damage to the damascene wiring layer 20. The capacitor may be formed without the silicon nitride layer 30 if an etch process for the bottom plate can be found which does not damage the copper damascene wiring layer 21 when capacitor layers are defined. FIG. 3B shows such a structure.

Figure 3A:
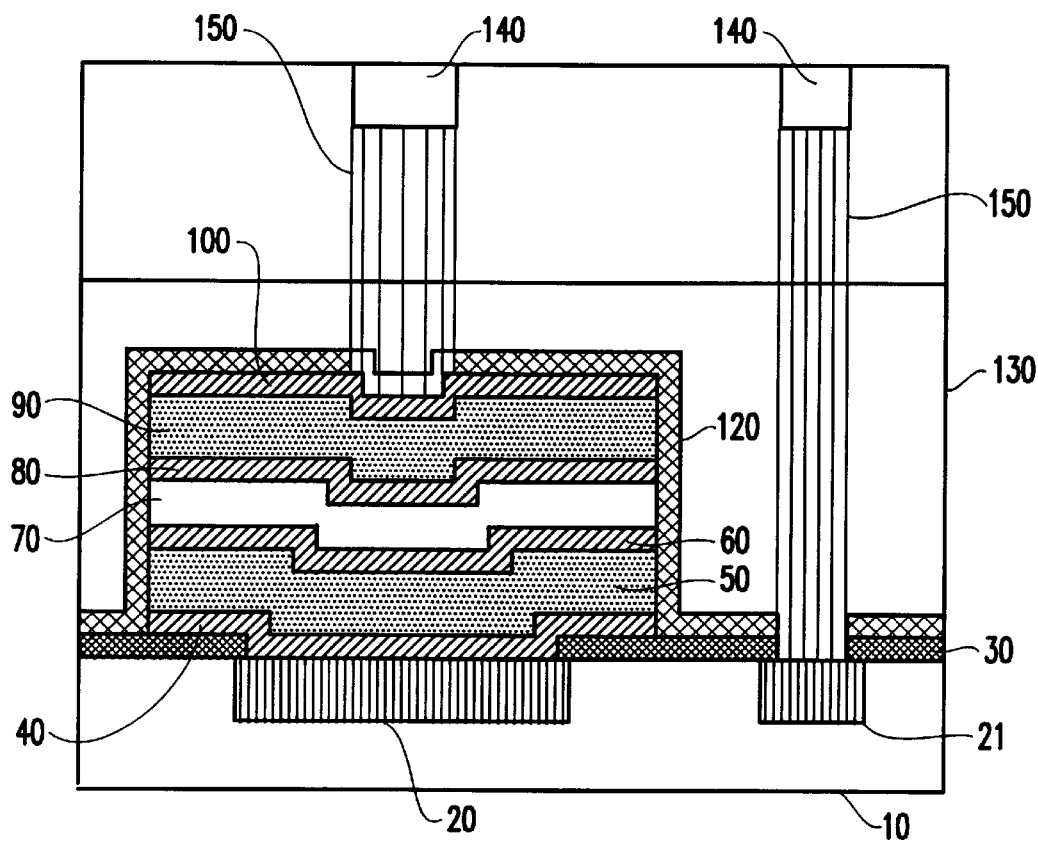
FIG. 3A shows a side view of a metal-insulator-metal capacitor according to the present invention.
Figure 3B:
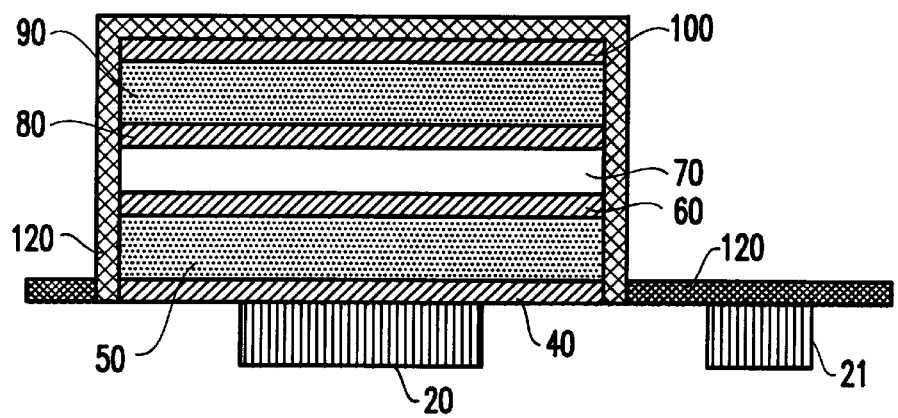
FIG. 3B shows an alternative embodiment of the present invention.

Subsequently, as shown in FIGS. 3A and 3B, a barrier layer 120 preferably made of silicon nitride ($Si_3N_4$) may be applied over the top and sides of the metal-insulator-metal capacitor using conventional deposition techniques such as those mentioned above to thereby surround portions of the capacitor stack and specifically the insulator layer 70. As shown in FIG. 3A, an interlayer dielectric (ILD) 130 is then deposited over the entire metal-insulator-metal capacitor stack and may be subsequently planarized using processes well known in the art such as CMP. Accordingly, the metal-insulator-metal capacitor is ready for via connections 150 to both the top of the metal-insulator-metal capacitor 100 and the copper damascene layer 21 using processes well known in the art such as lithographic masking, etching and conductive stud formation. For ease of illustration, FIG. 3B does not show the contacts 150.

Figure 4:
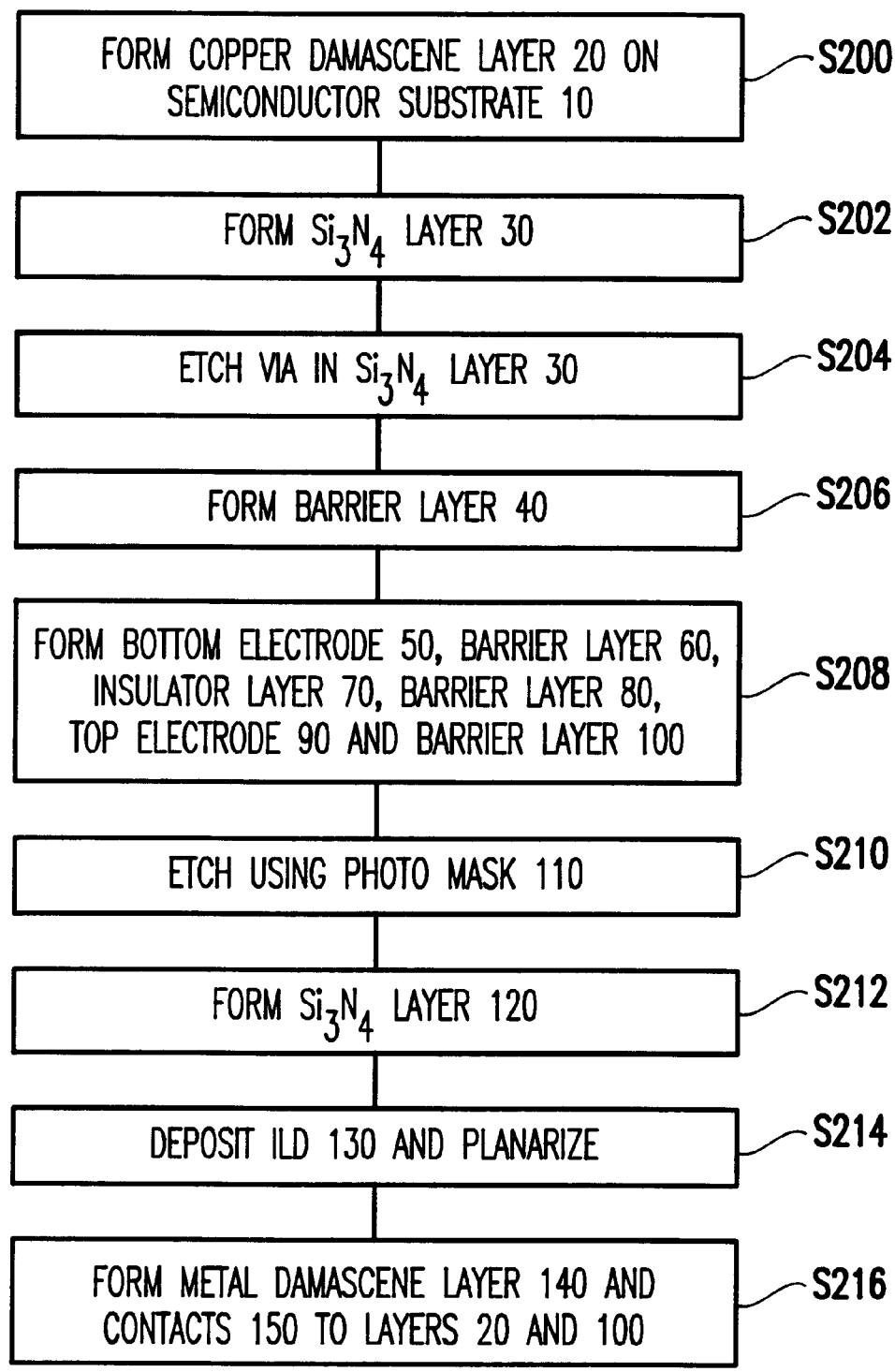
FIG. 4 shows a flow chart of a preferred method of the present invention.

FIG. 4 shows a flowchart of a preferred method of forming the capacitor structure according to the present invention. As shown in FIG. 4, a copper damascene layer 20, 21 may be formed in semiconductor substrate 10 in step S200. An $Si_3N_4$ layer 30 may then be formed in step S202 over the substrate 10. In step S204, a via may be etched in $Si_3N_4$ layer 30 to form the gap 25. When forming the capacitor structure of FIG. 3B, the steps S202 and S204 may be omitted. A barrier layer 40 may then be added in step S206 to make contact with the copper damascene layer 20. In step S208, the metal-insulator-metal capacitor may be formed including the bottom electrode 50, the barrier layer 60, the insulator layer 70, the barrier layer 80, the top electrode 90 and the barrier layer 100. In step S210, the photo mask 110 is used to etch back the capacitor stack. In step S212, the silicon nitride layer 120 may be added to the top and sides of the capacitor stack. In step S214, the interlayer dielectric 130 may be deposited and planarized. Finally, contacts 150 to the top capacitor plate, layer 100, and metal damascene layer 21 (and metal damascene layer 140), and a layer of wiring are made in a conventional fashion as shown in FIG. 3A.

The invention allows formation of a metal-to-metal capacitor with a chemical vapor deposited $SiO_2$, insulator over a copper damascene layer. The barrier layers 40, 100 provide low levels of charge trapping in a back end of line (BEOL) copper damascene process. The barrier layers prevent contact between the $SiO_2$ and copper damascene layer.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A capacitor structure formed on a semiconductor substrate, the capacitor structure comprising:

a first interconnect wiring embedded within a first planar insulator structure, at least a portion of said first interconnect wiring being exposed, said first interconnect wiring comprising a first conductor;

a first conductive barrier layer formed on said first planar insulator structure and being in contact with said exposed portion of said first interconnect wiring;

a first capacitor plate formed on said first conductive barrier layer;

a first capacitor dielectric barrier layer formed on said first capacitor plate;

a capacitor dielectric structure formed on said first dielectric barrier layer;

a second capacitor dielectric barrier layer formed on said capacitor dielectric structure;

a second capacitor plate formed on said second capacitor dielectric barrier layer;

a second conductive barrier layer formed on said second capacitor plate;

a second planar insulator structure formed on said second capacitor plate; and a second interconnect wiring embedded within said second planar insulator structure, said second interconnect wiring comprising said first conductor.

2. The capacitor structure of claim 1, wherein the first conductive barrier layer comprises tantalum nitride.

3. The capacitor structure of claim 1, wherein the second capacitor plate comprises at least one second conductor which is different from said first conductor.

4. The capacitor structure of claim 1, wherein the first conductor comprises copper damascene.

5. The capacitor structure of claim 1, wherein the first capacitor plate comprises at least one second conductor which is different from said first conductor.

6. A metal-insulator-metal capacitor structure for use with a metal damascene wiring structure comprising:

a first capacitor plate connected to a metal damascene layer;

a first capacitor dielectric barrier layer formed on said first capacitor plate;

a capacitor dielectric over said first capacitor dielectric barrier layer;

a second capacitor dielectric barrier layer formed on said capacitor dielectric; and a second capacitor plate over said second capacitor dielectric barrier layer.

7. The metal-insulator-metal capacitor structure of claim 6, further comprising an insulator below portions of a bottom barrier layer, said insulator layer including a gap area allowing said bottom barrier layer to contact said metal damascene layer.

8. The metal-insulator-metal capacitor structure of claim 7, wherein said bottom barrier layer comprises tantalum nitride.

9. The metal-insulator-metal capacitor structure of claim 6, further comprising an insulator structure above said second capacitor plate.

10. A method of forming a metal-insulator-metal capacitor structure over a metal damascene structure, said method comprising:

forming a first capacitor plate over said damascene structure;

forming a first capacitor dielectric barrier layer on said first capacitor plate;

forming a capacitor dielectric over said first capacitor dielectric barrier layer;

forming a second capacitor dielectric barrier layer over said capacitor dielectric; and forming a second capacitor plate over said second capacitor dielectric barrier layer.

11. The method of claim 10, wherein said first and second barrier layers comprise titanium nitride.

12. The method of claim 10, wherein said metal damascene comprises copper.

13. The method of claim 12, further comprising lithographically etching portions of said first capacitor plate, said capacitor dielectric and said second capacitor plate.

14. The method of claim 12, further comprising attaching interconnect wiring to said metal damascene.

15. A method of forming a capacitor structure on a semiconductor substrate comprising:

forming a first interconnect wiring embedded within a first planar insulator structure such that at least a portion of said first interconnect wiring is exposed, said first interconnect wiring comprising a first conductor;

forming a first conductive barrier layer on said first planar insulator structure and in contact with said exposed portion of said first interconnect wiring;

forming a first capacitor plate on said first conductive barrier layer;

forming a first capacitor dielectric barrier layer on said first capacitor plate;

forming a capacitor dielectric structure on said first capacitor dielectric barrier layer;

forming a second capacitor dielectric barrier layer on said capacitor dielectric structure;

forming a second capacitor plate on said second capacitor dielectric barrier layer;

forming a second conductive barrier layer on said second capacitor plate;

forming a second planar insulator structure on said second capacitor plate; and forming a second interconnect wiring within said second planar insulator structure, said second interconnect wiring comprising said first conductor.

16. The method of claim 15, wherein said first conductive barrier layer comprises tantalum nitride.

17. The method of claim 15, wherein said second capacitor plate comprises at least one second conductor which is different from said first conductor.

18. The method of claim 15, wherein said first conductor comprises copper damascene.

19. The method of claim 15, wherein said first capacitor plate comprises at least one second conductor which is different from said first conductor.

* * * * *